United States Patent [19]

Czubatyj et al.

[11] 4,419,533

[45] Dec. 6, 1983

[54] PHOTOVOLTAIC DEVICE HAVING INCIDENT RADIATION DIRECTING MEANS FOR TOTAL INTERNAL REFLECTION

[75] Inventors: Wolodymyr Czubatyj, Hamtramck; Rajendra Singh, Clawson; Joachim Doehler, Union Lake; David D. Allred, Troy; Jaime M. Reyes, Birmingham, all of Mich.

[73] Assignee: Energy Conversion Devices, Inc., Troy, Mich.

[21] Appl. No.: 354,285

[22] Filed: Mar. 3, 1982

[51] Int. Cl.³ ............................................. H01L 31/06
[52] U.S. Cl. .................................. 136/259; 136/249; 136/258; 357/30
[58] Field of Search .................. 136/246, 251, 249 TJ, 136/258 AM, 259; 357/30

[56] References Cited

U.S. PATENT DOCUMENTS

| | | | |
|---|---|---|---|
| 3,487,223 | 12/1969 | St. John | 250/216 |
| 3,873,829 | 3/1975 | Evrard et al. | 250/213 R |
| 3,973,994 | 8/1976 | Redfield | 136/259 |
| 4,153,813 | 5/1979 | Blieden et al. | 136/247 |
| 4,166,919 | 9/1979 | Carlson | 136/257 |
| 4,204,881 | 5/1980 | MdGrew | 136/246 |
| 4,289,920 | 9/1981 | Hovel | 136/246 |
| 4,328,390 | 5/1982 | Meakin et al. | 136/259 |

FOREIGN PATENT DOCUMENTS

| | | | |
|---|---|---|---|
| 3023165 | 1/1982 | Fed. Rep. of Germany | 136/259 |
| 55-108780 | 8/1980 | Japan | 136/258 |

OTHER PUBLICATIONS

J. Müller, "Thin Silicon Film p-i-n Photodiodes With Internal Reflection," *IEEE Trans. Electron Devices*, vol. ED-25, pp. 247-253 (1978).

A. Goetzberger, "Optical Confinement In Thin Si-Solar Cells by Diffuse Back Reflectors," *Conf. Record, 15th IEEE Photovoltaic Specialists Conf.* (1981), pp. 867-870.

"Multiple Pass Thin-Film Silicon Solar Cell;" D. Redfield, *Applied Physics Letters*, vol. 25, No. 11, Dec. 1, 1974, pp. 647-648.

"Design Considerations For a-Si Solar Cells," Vikram L. Dalal, *IEEE Transactions On Electron Devices*, vol. ED-27, No. 4, Apr. 1980, pp. 662-670.

"Photon Loss Analysis of Thin-Film CdS/Cu$_2$S Photovoltaic Devices," J. A. Bragagnolo, *Conf. Record, 13th IEEE Photovaltaic Specialists Conf.* (1978), pp. 412-416.

*Primary Examiner*—Aaron Weisstuch
*Attorney, Agent, or Firm*—Lawrence G. Norris

[57] ABSTRACT

There is disclosed new and improved photovoltaic devices which provide increased short circuit currents and efficiencies over that previously obtainable from prior devices. The disclosed devices include incident radiation directing means for directing at least a portion of the incident light through the active region or regions thereof at angles sufficient to substantially confine the directed radiation in the devices. This allows substantially total utilization of photogenerated electron-hole pairs. Further, because the light is directed through the active region or regions at such angles, the active regions can be made thinner to also increase collection efficiencies.

The incident radiation directors can be random surface or bulk reflectors to provide random scattering of the light, or periodic surface or bulk reflector to provide selective scattering of the light.

While the present invention is applicable to photovoltaic devices formed from any type of semiconductor material, as for example, crystalline, polycrystalline, or amorphous semiconductor alloys or any combination thereof, disclosure herein is primarily directed to photovoltaic devices formed from amorphous silicon alloys preferably incorporating fluorine as a density of states reducing element. The disclosure is also directed to, without limitation, photovoltaic devices of the p-i-n configuration, both as single cells and multiple cells arranged in tandem.

19 Claims, 11 Drawing Figures

PHOTOVOLTAIC DEVICE HAVING INCIDENT RADIATION DIRECTING MEANS FOR TOTAL INTERNAL REFLECTION

BACKGROUND OF THE INVENTION

This invention relates to improved photovoltaic devices which provide enhanced short circuit currents and efficiencies. The present invention has particular applicability to photovoltaic devices formed from layers of amorphous semiconductor alloys. The photovoltaic devices of the present invention include incident radiation directing means for directing either a portion or substantially all of the incident radiation through the active region or regions, wherein the charge carriers are created, at angles sufficient to cause the directed radiation to be substantially confined within the devices. This provides multiple reflections of the directed light in the active regions of the devices in which they are employed. One advantage of this approach is that increased photon absorption and charge carrier generation in the active regions is possible, providing increased short circuit currents. Another advantage is that since the directed light passes through the active region of the improved devices at an angle, the active region or regions can be made thinner to reduce charge carrier recombination while maintaining efficient charge carrier generation. The invention while not being limited to any particular device configuration, has its most important application in making improved amorphous silicon alloy photovoltaic devices of the p-i-n configuration, either as single cells or multiple cells comprising a plurality of single cell units.

Silicon is the basis of the huge crystalline semiconductor industry and is the material which has produced expensive high efficiency (18 percent) crystalline solar cells for space applications. For terrestrial applications, the crystalline solar cells typically have much lower efficiencies, on the order of 12 percent or less. When crystalline semiconductor technology reached a commercial state, it became the foundation of the present huge semiconductor device manufacturing industry. This was due to the ability of the scientist to grow substantially defect-free germanium and, particularly, silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure crystalline materials, to increase their electrical conductivity and to control their being either of a p or n conduction type. The fabrication processes for making p-n junction crystals involve extremely complex, time consuming, and expensive procedures. Thus, these crystalline materials useful in solar cells and current control devices are produced under very carefully controlled conditions by growing individual single silicon or germanium crystals, and when p-n junctions are required, by doping such single crystals with extremely small and critical amounts of dopants.

These crystal growing processes produce such relatively small crystals that solar cells require the assembly of many single crystals to encompass the desired area of only a single solar cell panel. The amount of energy necessary to make a solar cell in this process, the limitation caused by the size limitations of the silicon crystal, and the necessity to cut up and assemble such a crystalline material have all resulted in an impassable economic barrier to the large scale use of crystalline semiconductor solar cells for energy conversion. Further, crystalline silicon has an indirect optical edge which results in poor light absorption in the material. Because of the poor light absorption, crystalline solar cells have to be at least 50 microns thick to absorb the incident sunlight. Even if the single crystal material is replaced by polycrystalline silicon with cheaper production processes, the indirect optical edge is still maintained; hence the material thickness is not reduced. The polycrystalline materials also contain grain boundaries and other defect problems, which are ordinarily deleterious.

In summary, crystal silicon devices have fixed parameters which are not variable as desired, require large amounts of material, are only producible in relatively small areas and are expensive and time consuming to produce. The use of devices based upon amorphous silicon alloys can eliminate these crystal line silicon disadvantages. An amorphous silicon alloy has an optical absorption edge having properties similar to a direct gap semiconductor and only a material thickness of one micron or less is necessary to absorb the same amount of sunlight as the 50 micron thick crystalline silicon. Further, amorphous silicon alloys can be made faster, easier and in larger areas than can crystalline silicon.

Accordingly, a considerable effort has been made to develop processes for readily depositing amorphous semiconductor alloys or films, each of which can encompass relatively large areas, if desired, limited only by the size of the deposition equipment, and which could be readily doped to form p-type and n-type materials which p-n junction devices are to be made therefrom equivalent to those produced by their crystalline counterparts. For many years such work was substantially unproductive. Amorphous silicon or germanium (Group IV) films are normally four-fold coordinated and were found to have microvoids and dangling bonds and other defects which produce a high density of localized states in the energy gap thereof. The presence of a high density of localized states in the energy gap of amorphous silicon semiconductor films results in a low degree of photoconductivity and short carrier lifetime, making such films unsuitable for photoresponsive applications. Additionally, such films cannot be successfully doped or otherwise modified to shift the Fermi level close to the conduction or valence bands, making them unsuitable for making p-n junction for solar cell and current control device applications.

In an attempt to minimize the aforementioned problems involved with amorphous silicon (originally thought to be elemental), W. E. Spear and P. G. Le Comber of Carnegie Laboratory of Physics, University of Dundee, in Dundee, Scotland, did some work on "Substitutional Doping of Amorphous Silicon", as reported in a paper published in *Solid State Communications,* Vol. 17, pp. 1193-1196 (1975), toward the end of reducing the localized states in the energy gap in amorphous silicon to make the same approximate more closely intrinsic crystalline silicon and of substitutionally doping the amorphous materials with suitable classic dopants, as in doping crystalline materials, to make them extrinsic and of p or n conduction types.

The reduction of the localized states was accomplished by glow discharge deposition of amorphous silicon films wherein silane ($SiH_4$) gas was passed through a reaction tube where the gas was decomposed by an r.f. glow discharge and deposited on a substrate at a substrate temperature of about 500°–600° K. (227°–327° C.). The material so deposited on the substrate was an intrinsic amorphous material consisting of silicon and hydrogen. To produce a doped amorphous material phosphine (PH$_3$) gas for n-type conduction or diborane (B$_2$H$_6$) gas for p-type conduction were premixed with the silane gas and passed through the glow discharge reaction tube and under the same operating conditions. The gaseous concentration of the dopants used was between about $5 \times 10^{-6}$ and $10^{-2}$ parts per volume. The material so deposited was shown to be extrinsic and of n or p conduction type.

While it was not known by these researchers, it is now known by the work of others that the hydrogen in the silane combines at an optimum temperature with many of the dangling bonds of the silicon during the glow discharge deposition, to substantially reduce the density of the localized states in the energy gap toward the end of making the electronic properties of the amorphous material approximate more nearly those of the corresponding crystalline material.

The incorporation of hydrogen in the above method, however, has limitations based upon the fixed ratio of hydrogen to silicon in silane, and various Si:H bonding configurations which introduce new antibonding states. Therefore, there are basic limitations in reducing the density of localized states in these materials.

Greatly improved amorphous silicon alloys having significantly reduced concentrations of localized states in the energy gaps thereof and high quality electronic properties have been prepared by glow discharge, as fully described in U.S. Pat. No. 4,226,898, Amorphous Semiconductors Equivalent to Crystalline Semiconductors, issued in the names of Stanford R. Ovshinsky and Arun Madan on Oct. 7, 1980, and by vapor deposition as fully described in U.S. Pat. No. 4,217,374 to Stanford R. Ovshinsky and Masatsugu Izu, which issued on Aug. 12, 1980, under the same title. As disclosed in these patents, which are incorporated herein by reference, fluorine is introduced into the amorphous silicon semiconductor alloy to substantially reduce the density of localized states therein. Activated fluorine especially readily bonds to silicone in the amorphous body to substantially decrease the density of localized defect states therein, because the small size, high reactivity and specificity of chemical bonding of the fluorine atoms enables them to achieve a more defect-free amorphous silicon alloy. The fluorine bonds to the dangling bonds of the silicon and forms what is believed to be a predominantly ionic stable bond with flexible bonding angles, which results in a more stable and more efficient compensation or alteration than is formed by hydrogen and other compensating or altering agents. Fluorine also combines in a preferable manner with silicon and hydrogen, utilizing the hydrogen in a more desirable manner, since hydrogen has several bonding options. Without fluorine, hydrogen may not bond in a desirable manner in the material, causing extra defect status in the band gap as well as in the material itself. Therefore, fluorine is considered to be a more efficient compensating or altering element than hydrogen when employed alone or with hydrogen because of its high reactivity, specificity in chemical bonding, and high electronegativity.

As an example, compensation may be achieved with fluorine alone or in combination with hydrogen, with the addition(s) of these element(s) being in very small quantities (e.g., fractions of one atomic percent). However, the amounts of fluorine and hydrogen most desirably used are much greater than such small percentages, so as to form a silicon-hydrogen-fluorine alloy. Such alloying amounts of fluorine and hydrogen may, for example, be in the range of 1 to 5 percent or greater. It is believed that the alloy so formed has a lower density of defect states in the energy gap than that achieved by the mere neutralization of dangling bonds and similar defect states. Such larger amount of fluorine, in particular, is believed to participate substantially in a new structural configuration of an amorphous silicon-containing material and facilitates the addition of other alloying materials, such as germanium. Fluorine, in addition to its other characteristics mentioned herein, is believed to be an organizer of local structure in the silicon-containing alloy through inductive and ionic effects. It is believed that fluorine also influences the bonding of hydrogen by acting in a beneficial way to decrease the density of defect states which hydrogen contributes while acting as a density of states reducing element. The ionic role that fluorine plays in such an alloy is believed to be an important factor in terms of the nearest neighbor relationships.

Amorphous silicon alloys containing fluorine have thus demonstrated greatly improved characteristics for photovoltaic applications as compared to amorphous silicon alloys containing just hydrogen alone as a density of states reducing element. However, in order to realize the full advantage of these amorphous silicon alloys containing fluorine when used to form the active regions of photovoltaic devices, it is necessary to assure that the greatest possible portion of the available photons are absorbed therein for efficiently generating electron-hole pairs.

The foregoing is important in, for example, photovoltaic devices of the p-i-n configuration. Devices of this type have p and n-type doped layers on opposite sides of an active intrinsic layer, wherein the electron-hole pairs are generated. They establish a potential gradient across the device to facilitate the separation of the electrons and holes and also form contact layers to facilitate the collection of the electrons and holes as electrical current.

Not all of the available photons are absorbed by the active regions in a single pass therethrough. While almost all of the shorter wavelength photons are absorbed during the first pass, a large portion of the longer wavelength photons, for example, photons having wavelengths of 6,000 angstroms or greater, are not so absorbed. The loss of these unabsorbed photons places a limit on the short circuit currents which can be produced. To preclude the loss of these longer wavelength photons, back reflectors, formed from conductive metals have been employed to reflect the unused or unabsorbed light back into the active regions of the devices.

The p and n-type layers are conductive and, at least in the case of the p-type layer, can have a wide band gap to decrease photon absorption. A back reflector is therefore extremely advantageous when used in conjunction with a p-type layer having a wide band gap forming the top layer of such a device. Back reflectors are also advantageous when the wide band gap p-type layer forms the bottom layer of the device. In either case, back reflecting layers serve to reflect unused light back into the intrinsic region of the device to permit further utilization of the solar energy for generating additional electron-hole pairs. A back reflecting layer permits a greater portion of the available photons to pass into the active intrinsic layer and to be absorbed therein.

Unfortunately, the best back reflectors of the prior art have been capable of reflecting only about 80 percent of the unused light back into the devices in which they are employed. Metals such as copper and aluminum, because they are highly reflecting, have been suggested as possible back reflector materials. However, these metals can diffuse into the semiconductor of the devices in which they are employed and, in doing so, adversely affect the photoresponsive characteristics of the devices. As a result, other less reflective metals have been employed as back reflectors. Such less reflective metals include molybdenum and chromium. Although these metals do not diffuse into the semiconductor of the devices, they cannot achieve the reflectance of the more highly reflective metals. This is particularly true when the less reflective metals interface with a material such as amorphous silicon alloys which have a high index of refraction. Furthermore, the back reflectors of the prior art reflect the unused light back into the active regions in the same direction as the original direction of incidences (assuming normal incidence). Hence, after being reflected, the light which is not absorbed during the second pass is permitted to escape. Hence, not all the light is absorbed. Also, since the light passes normal to the active regions, the active regions must be of sufficient thickness to permit efficient absorption. However, because the minority carrier diffusion length is finite, the active region cannot be made arbitrarily thick. If, to achieve substantial absorption, the active region thickness is increased much beyond the diffusion length, recombination effects will predominate, making it difficult to efficiently collect the photogenerated charge carriers as electrical current. Hence, there is a need for better photovoltaic devices which not only provide greater utilization of the incident light, but also more efficient collection of the charge carriers created in the active region or regions of the devices.

Applicants herein have discovered new and improved photovoltaic devices which provide both increased light utilization for creating electron-hole pairs and more efficient collection of the charge carriers. Basically, the present invention provides means for directing at least a portion of the incident radiation through the active region or regions at an angle which is sufficient to confine the directed light within the devices to substantially increase absorption. Further, the present invention permits the active regions to be made thinner to reduce recombination effects. The radiation directors of the present invention can be utilized in any form of photovoltaic cell, and find particular application in thin film solar cells in both single cell photovoltaic devices of the p-i-n configuration, and multiple cell structures having a plurality of single cell units.

SUMMARY OF THE INVENTION

The present invention provides new and improved photovoltaic devices having incident radiation directing means for directing at least a portion of the incident radiation through the active region or regions, wherein the charge carriers are created, at an angle sufficient to substantially confine the directed radiation within the photovoltaic devices. For normal radiation incidence, the radiation directing means directs the radiation through the active region or regions at angles at least greater than the angle (the critical angle) whose sine is the index of refraction of air divided by the index of refraction of the material which forms the active region or regions. The incident radiation directing means of the present invention provide multiple passes of light within the active regions of the devices in which they are employed to enable substantially total absorption while assuring more complete collection of the electron-hole pairs.

The radiation directors can be either random or periodic reflecting or transmitting structures. The random and periodic reflecting structures can be either surface or bulk reflectors. For example, the random surface reflector can be a roughened reflective surface of aluminum, gold, silver, copper, or other highly reflective material. The periodic surface reflector can be a reflective diffraction grating and preferably a blazed diffraction grating. The grating spacing can be optimized for reflecting light of predetermined wavelengths and the grating shapes and heights can be optimized for selecting the order and reflectance order magnitudes as desired to achieve internal reflection at desired material interfaces.

The random bulk reflector can be, for example, a body of ceramic material such as titanium dioxide, zinc selenide, alumina, zinc sulphide, selenium, and silicon carbide, or a body of enamel material. The grains and randomly distributed facets of the polycrystalline components of these materials provide random reflections from their bulk. The bulk periodic reflector can be, for example, a hologram.

Over each of the foregoing reflectors a coating of a transparent conductor such as a transparent conductive oxide can be deposited. When these reflectors are utilized as the substrates for the devices, the transparent conductive oxides serve as a contact layer. The transparent conductive oxide can be indium tin oxide, cadmium stannate, or doped tin oxide, for example.

By directing the light through the active region or regions at an angle greater than the critical angle for an air-active region material interface, the directed light will be internally reflected and substantially confined within the devices. The radiation directors of the present invention therefore enable substantially total absorption of light for the generation of electron-hole pairs within the devices.

The present invention is particularly applicable in photovoltaic devices of p-i-n configuration. Such devices include an intrinsic active semiconductor region wherein photogenerated electron-hole pairs are created and doped regions of opposite conductivity disposed on opposite respective sides of the intrinsic region. The active intrinsic region is preferably an amorphous silicon alloy body or layer containing fluorine as a density of states reducing element. The doped regions also preferably include an amorphous silicon wide band gap p-type alloy layer forming either the top or bottom semiconductor layer of the device. In either case, the amorphous semiconductor regions are preferably deposited onto the radiation reflectors with the layer of transparent conductor disposed between the radiation director and the bottom doped layer. Alternatively, in accordance with the present invention, a transparent radiation director can be provided on the top doped layer. Such a transparent radiation director can be, for example, a transmission diffraction grating.

Substantially all of the shorter wavelength photons are absorbed in the active intrinsic regions during the first pass therethrough, while only a portion of the photons having wavelengths longer than about 6000 Å are so absorbed. The periodic reflectors can be optimized for these longer wavelengths to optimize the directing of the longer wavelength photons. To that end, the angle of diffraction provided by a diffraction grating can be determined by the relationship:

$$\theta_{Diff} = \text{Sin}^{-1} \frac{m\lambda}{nd}$$

Where:
 d is the grating spacing;
 λ is the minimum photon vacuum wavelength to be diffracted;
 n is the index of refraction of the medium in which the grating diffracts the radiation into; and
 m is the diffraction order.

The back reflector systems of the present invention can also be utilized in multiple cell devices, such as tandem cells.

DESCRIPTION OF THE PREFERRED EMBODIMENTS

Figure 1:
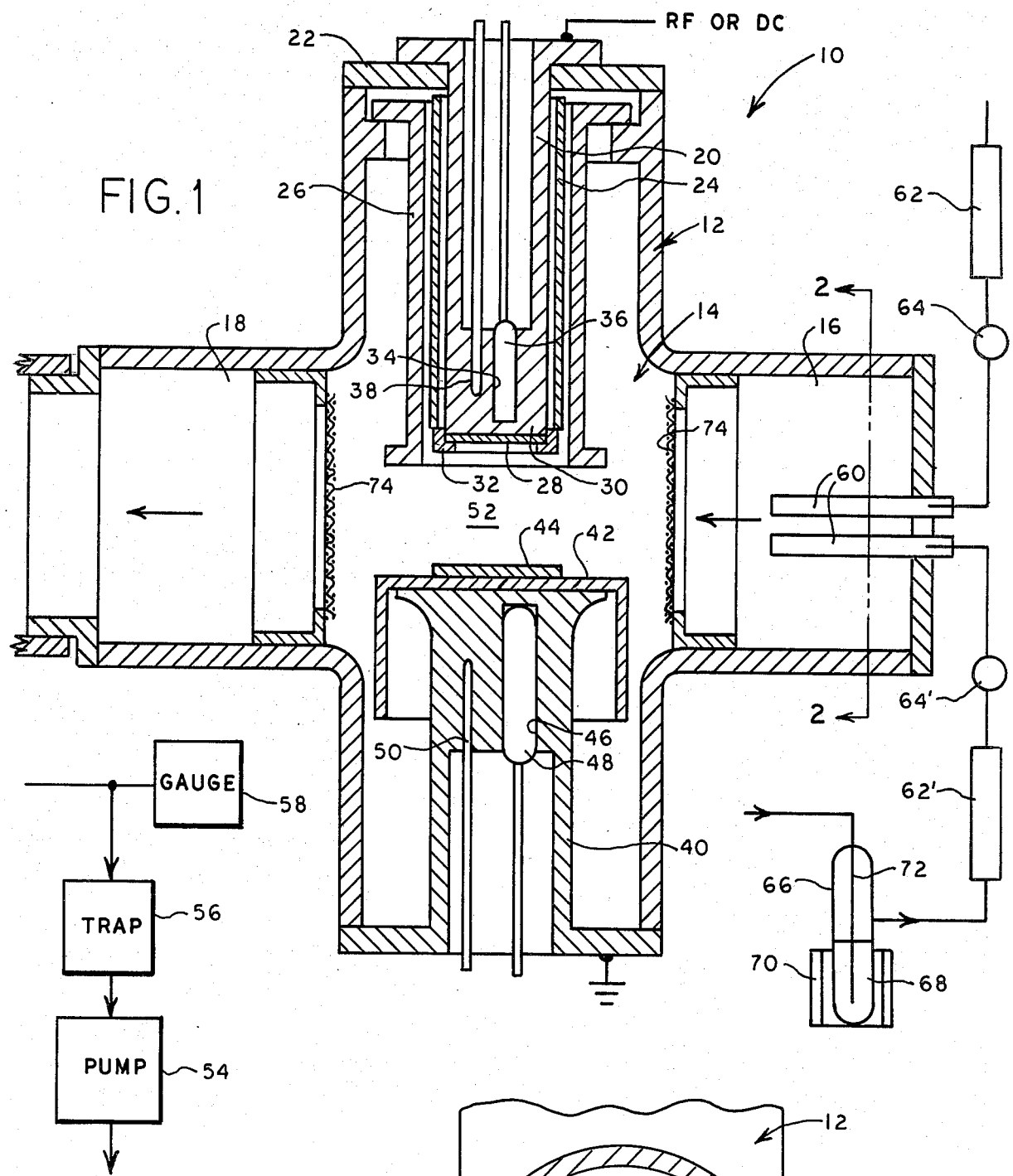
FIG. 1 is a diagrammatic representation of a glow discharge deposition system which may be utilized for making the photovoltaic devices of the invention.
Figure 2:
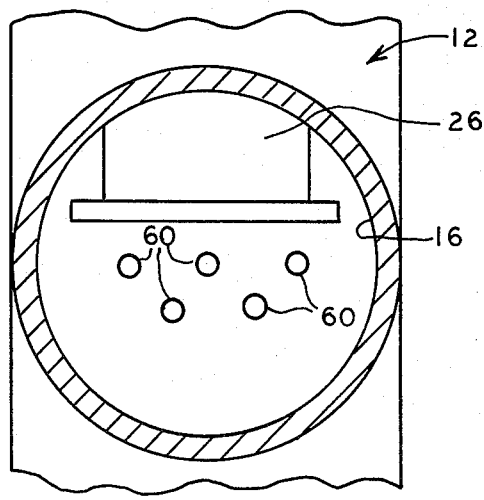
FIG. 2 is a sectional view of a portion of the system of FIG. 1 taken along the lines of 2—2 therein.

Referring now more particularly to FIG. 1, there is shown a glow discharge deposition system 10 including a housing 12. The housing 12 encloses a vacuum chamber 14 and includes an inlet chamber 16 and an outlet chamber 18. A cathode backing member 20 is mounted in the vacuum chamber 14 through an insulator 22.

The backing member 20 includes an insulating sleeve 24 circumferentially enclosing the backing member 20.

A dark space shield 26 is spaced from and circumferentially surrounds the sleeve 24. A substrate 28 is secured to an inner end 30 of the backing member 20 by a holder 32. The holder 32 can be screwed or otherwise conventionally secured to the backing member 20 in electrical contact therewith.

The cathode backing member 20 includes a well 34 into which is inserted an electrical heater 36 for heating the backing member 20 and hence the substrate 28. The cathode backing member 20 also includes a temperature responsive probe 38 for measuring the temperature of the backing member 20. The temperature probe 38 is utilized to control the energization of the heater 36 to maintain the backing member 20 and the substrate 28 at any desired temperature.

The system 10 also includes an electrode 40 which extends from the housing 12 into the vacuum chamber 14 spaced from the cathode backing member 20. The electrode 40 includes a shield 42 surrounding the electrode 40 and which in turn carries a substrate 44 mounted thereon. The electrode 40 includes a well 46 into which is inserted an electrode heater 48. The electrode 40 also includes a temperature responsive probe 50 for measuring the temperature of the electrode 40 and hence the substrate 44. The probe 50 is utilized to control the energization of the heater 48 to maintain the electrode 40 and the substrate 44 at any desired temperature, independently of the member 20.

A glow discharge plasma is developed in a space 52 between the substrates 28 and 44 by the power generated from a regulated R.F., A.C. or D.C. power source coupled to the cathode backing member 20 across the space 52 to the electrode 40 which is coupled to ground. The vacuum chamber 14 is evacuated to the desired pressure by a vacuum pump 54 coupled to the chamber 14 through a particle trap 56. A pressure gauge 58 is coupled to the vacuum system and is utilized to control the pump 54 to maintain the system 10 at the desired pressure.

The inlet chamber 16 of the housing 12 preferably is provided with a plurality of conduits 60 for introducing materials into the system 10 to be mixed therein and to be deposited in the chamber 14 in the glow discharge plasma space 52 upon the substrates 28 and 44. If desired, the inlet chamber 16 can be located at a remote location and the gases can be premixed prior to being fed into the chamber 14. The gaseous materials are fed into the conduits 60 through a filter or other purifying device 62 at a rate controlled by a valve 64.

When a material initially is not in a gaseous form, but instead is in a liquid or solid form, it can be placed into a sealed container 66 as indicated at 68. The material 68 then is heated by a heater 70 to increase the vapor pressure thereof in the container 66. A suitable gas, such as argon, is fed through a dip tube 72 into the material 68 so as to entrap the vapors of the material 68 and convey the vapors through a filter 62' and a valve 64' into the conduits 60 and hence into the system 10.

The inlet chamber 16 and the outlet chamber 18 preferably are provided with screen means 74 to confine the plasma in the chamber 14 and principally between the substrates 28 and 44.

The materials fed through the conduits 60 are mixed in the inlet chamber 16 and then fed into the glow discharge space 52 to maintain the plasma and deposit the alloy on the substrates with the incorporation of silicon, fluorine, oxygen and the other desired alterant elements, such as hydrogen, and/or dopants or other desired materials.

In operation, and for depositing layers of intrinsic amorphous silicon alloys, the system 10 is first pumped down to a desired deposition pressure, such as less than 20 mtorr, prior to deposition. Starting materials or reaction gases such as silicon tetrafluoride (SiF$_4$) and molecular hydrogen (H$_2$) and/or silane are fed into the inlet chamber 16 through separate conduits 60 and are then mixed in the inlet chamber. The gas mixture is fed into the vacuum chamber to maintain a partial pressure therein of about 0.6 torr. A plasma is generated in the space 52 between the substrates 28 and 44 using either or both a DC voltage of greater than 600 volts or radio frequency power of about 10 to 15 watts operating at a frequency of 13.56 MHz or other desired frequency.

In addition to the intrinsic amorphous silicon alloys deposited in the manner as described above, the devices of the present invention as illustrated in the various embodiments to be described hereinafter also utilize doped amorphous silicon alloys including wide band gap p-type amorphous silicon alloys. These doped alloy layers can be p, p+, n, or n+ type in conductivity and can be formed by introducing an appropriate dopant into the vacuum chamber along with the intrinsic starting material such as silane (SiH$_4$) the silicon tetrafluoride (SiF$_4$) starting material and/or hydrogen and/or silane.

For n or p doped layers, the material can be doped with 5 to 100 ppm of dopant materials as it is deposited. For n+ or p+ doped layers, the material is doped with 100 ppm to over 1 percent of dopant material as it is deposited. The n dopants can be phosphorus, arsenic, antimony, or bismuth. Preferably, the n doped layers are deposited by the glow discharge decomposition of at least silicon tetrafluoride (SiF$_4$) and phosphine (PH$_3$). Hydrogen and/or silane gas (SiH$_4$) may also be added to this mixture.

The p dopants can be boron, aluminum, gallium, indium, or thallium. Preferably, the p-type layers are deposited by the glow discharge decomposition of at least silane and diborane (B$_2$H$_6$) or silicon tetrafluoride and diborane. To the silicon tetrafluoride and diborane, hydrogen and/or silane can also be added.

In addition to the foregoing, and in accordance with the present invention, the p-type layers are formed from amorphous silicon alloys containing at least one band gap increasing element. For example, carbon and/or nitrogen can be incorporated into the p-type alloys to increase the band gaps thereof. A wide band gap p type amorphous silicon alloy can be formed for example by a gas mixture of silicon tetrafluoride (SiF$_4$), silane (SiH$_4$), diborane (B$_2$H$_6$), and methane (CH$_4$). This results in a p-type amorphous silicon alloy having a wide band gap.

The doped layers of the devices are deposited at various temperatures depending upon the material to be deposited and the substrate used. For aluminum substrates, the upper temperature should not be above about 600° C. and for stainless steel it could be above about 1000° C. For the intrinsic and doped alloys initially compensated with hydrogen, as for example those deposited from silane gas starting material, the substrate temperature should be less than about 400° C. and preferably between 250° C. and 350° C.

Other materials and alloying elements may also be added to the intrinsic and doped layers to achieve optimized current generation. These other materials and elements will be described hereinafter in connection with the device configurations embodying the present invention illustrated in FIGS. 4 through 10.

Figure 3:
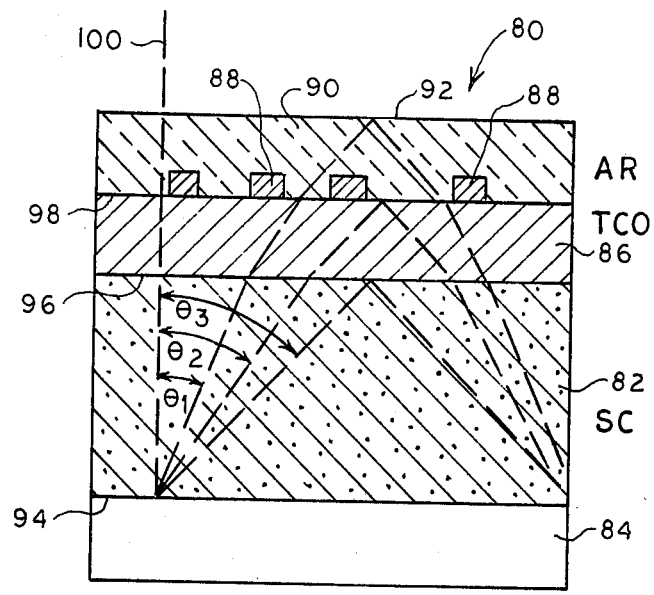
FIG. 3 is a sectional view in schematic form, of a photovoltaic device embodying the present invention which illustrates the general principles and advantages of the present invention.

Referring now to FIG. 3, it illustrates in generally schematic sectional view a photovoltaic device 80 which is referred to herein to facilitate a general understanding of the features and advantages of the present invention. The device 80 can be of any configuration for a photovoltaic device and can be, for example, a p-i-n device, p-n device, or Schottky barrier device, for example. The device includes a body 82 of semiconductor material which can be crystalline, polycrystalline, or amorphous semiconductor material or any combination of these. As will be disclosed in reference to FIGS. 4 through 10, the body 82 of semiconductor material is preferably but not limited to an amorphous silicon alloy including at least one active region wherein photogenerated electron-holes are created.

The body 82 of semiconductor material is disposed on radiation directing means 84 which can be conductive or coated with a conductive material, such as a transparent conductive oxide, to form a bottom contact for the device 80. Overlying the semiconductor body 82 is a layer 86 of conductive material such as a transparent conductive oxide (TCO). The TCO can be, for example, indium tin oxide, cadmium stannate, or doped tin oxide. Deposited onto the conductive layer 86 is a grid pattern 88. The grid 88 can be a plurality of orthogonally related lines of a conductive metal and cover about 5 to 10 percent of the surface area of the layer 86. The layer 86 and grid 88 serve as the top contact for the device. Deposited over the grid 88 and conductive layer 86 is an anti-reflection (AR) layer 90. Layers of this type will be described in greater detail subsequently. A layer of glass encapsulant may be used in place of the AR layer 90 as well.

As can be observed in FIG. 3, the radiation directing means 84, semiconductor body 82, conductive layer 86, and AR coating 90 are all substantially planar and define substantially parallel interfaces 94, 96, and 98. The radiation incident surface 92 of the device 80 and the interfaces 94, 96, and 98 are arranged to receive incident light represented by the dashed ray line 100 substantially normal thereto.

With prior art back reflectors, the photons of ray 100 not absorbed in the semiconductor body 82 during the second or reflected pass therethrough are free to escape from the front surface of the device. This results because the ray 100 is reflected along its initial line of incidence to the device.

In accordance with the present invention, the ray 100 will not escape from the device because the incident radiation directing means 84 directs the ray through the semiconductor material at an angle sufficient to cause the ray to be substantially confined within the device 80. More specifically, when the ray 100 impinges upon the radiation directing means 84, it is reflected therefrom at an angle $\theta_1$ which is greater than the critical angle for an interface between the material forming semiconductor body 82 and air. For example, if the body 82 is an amorphous silicon alloy having an index of refraction (n) of 3.5, the $\theta_c$ is 16.6°. This angle can be calculated using Snell's law, where, for total reflection, $\theta_c$ is given by the relationship:

$$\theta_c = \sin^{-1}\frac{n1}{n2}$$

Where:

$n_1$ is the lower index of refraction; and $n_2$ is the higher index of refraction.

Here, n, is equal to 1 for air and $n_2$ is equal to 3.5 for amorphous silicon. Hence, $n_1$ divided by $n_2$ is equal to 0.286 and the angle whose sine is 0.286 is 16.6°.

Any ray directed through the semiconductor body 82 (assuming it is amorphous silicon) at an angle of 16.6° or greater to the normal will be internally reflected within the device at least at the incident surface 92. However, the internal reflection can occur earlier, for example at interface 98 or interface 96. For the internal reflection to occur at interface 98 where the antireflection (AR) or glass layer 90 can have an index of refraction of about 1.45 the ray would have to be directed away from the normal by an angle $\theta_2$ which is equal to or greater than 24.5°. Similarly, for the internal reflection to occur at interface 96 where the TCO material can have an index of refraction of 2.0, the critical angle $\theta_3$ would be 34.8°. As will be disclosed hereinafter, the incident radiation directing means 84 can, in accordance with the present invention take many different forms for directing at least a portion of the incident radiation through the active region or regions of photovoltaic devices at angles sufficient to substantially confine the directed radiation within the devices. The incident radiation directing means can be a random reflector or a periodic reflector. With a random reflector, not all incident radiation is confined but internal reflection can take place at any one of the interfaces or surfaces previously discussed. With a periodic reflector, the angles of direction can be controlled so that nearly all of the light reaching this form of incident radiation directing means can be confined. Additionally, the angle of direction can be controlled so that a specific interface where internal reflection takes place can be selected. The radiation which is directed by the radiation directing means 84 is primarily light in the red spectrum or longer wavelengths since the shorter wavelengths are more readily adsorbed during the first pass through the amorphous silicon alloy material. However, as will be seen in relation to FIG. 7, the incident radiation can be directed through the active region in accordance with the present invention during its first pass into a device.

Figure 4:
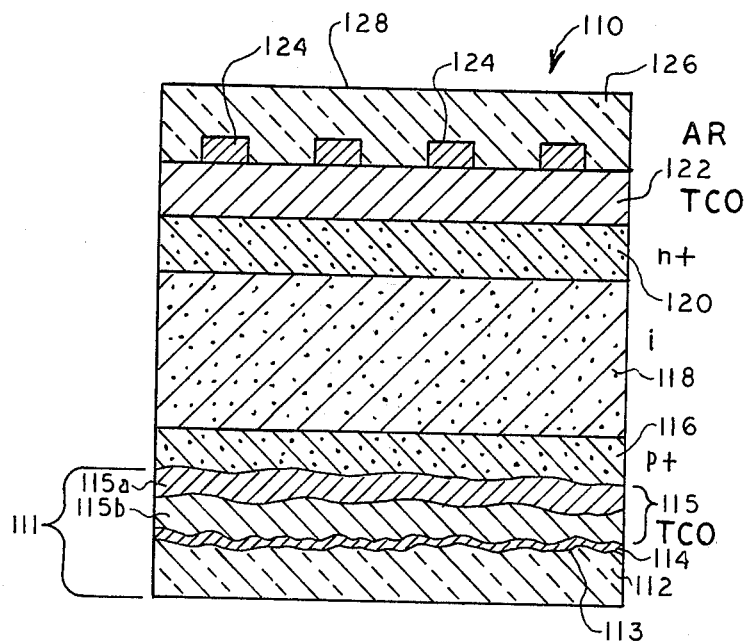
FIG. 4 is a sectional view of a p-i-n photovoltaic device including a random surface reflector embodying the present invention.

Referring now to FIG. 4, it illustrates in sectional view a p-i-n device 110 including a random surface reflector 111 embodying the present invention. The random surface reflector 111 includes a substrate 112 which may be glass. The glass 112 has an upper surface which is randomly roughened by, for example, sandblasting to form an upper roughened surface 113. Sandblasting is a well known process in which very fine particle grains of an abrasive are projected at high velocity against the surface to be roughened. The substrate 112 is of a width and length as desired.

In accordance with the present invention, a layer 114 of highly reflective metal is deposited upon the roughened glass surface 113. The layer 114 is deposited by vapor deposition, which is a relatively fast deposition process. The layer 114 preferably is a highly reflecting metal such as silver, aluminum, gold, copper or any other highly reflecting material. Deposited over the layer 114 is a layer 115 of a transparent conductor such as a transparent conductive oxide (TCO). The transparent conductor must at least be transparent for the photons having wavelengths which are not initially absorbed during the first pass through the device. The TCO layer 115 can be deposited in a vapor deposition environment and, for example, may be mutiple layers 115a and 115b of indium tin oxide (ITO), cadmium stannate ($Cd_2SnO_4$), cadmium oxide (CdO), cadmium sulphide (CdS), zinc oxide (ZnO), cuprous oxide ($Cu_2O$), barium plumbate ($Ba_2PbO_4$), or tin oxide ($SnO_2$) or a single layer of any of the foregoing. The TCO layer or layers 115 serves as a back contact for the device 110 and also serves as a smoothing layer to provide a substantially more planar surface upon which the semiconductor can be deposited. The TCO layer or layers also serves as a diffusion barrier to prevent diffusion of the highly conductive metal forming layer 114 into the semiconductor material of the device. The glass substrate 112, the layer 114 of highly reflective metal, and the layer 115 of transparent conductor form a random surface reflector in accordance with the present invention. Because the layer 112 is randomly roughened, at least a portion of the incident light striking the reflector 111 will be directed through the device at an angle sufficient to cause the directed light to be confined within the device as previously described.

The random surface reflector 111 is then placed in the glow discharge deposition environment. A first doped wide band gap p-type amorphous silicon alloy layer 116 is deposited on the layer 115 in accordance with the present invention. The layer 116 as shown is p+ in conductivity. The p+ region is as thin as possible, on the order of 50 to 500 angstroms in thickness, which is sufficient for the p+ region to make good ohmic contact with the transparent conductive oxide layer 115. The p+ region also serves to establish a potential gradient across the device to facilitate the collection of photo induced electron-hole pairs as electrical current. The p+ region 116 can be deposited from any of the gas mixtures previously referred to for the deposition of such material in accordance with the present invention.

A body of intrinsic amorphous silicon alloy 118 is next deposited over the wide band gap p-type layer 116. The intrinsic body 118 is relatively thick, on the order of 4500 Å, and is deposited from silicon tetrafluoride and hydrogen and/or silane. The intrinsic body preferably contains the amorphous silicon alloy compensated with fluorine where the majority of the electron-hole pairs are generated. The short circuit current of the device is enhanced by the combined effects of the back reflector of the present invention and the wide band gap of the p-type amorphous silicon alloy layer 116.

Deposited on the intrinsic body 118 is a further doped layer 120 which is of opposite conductivity with respect to the first doped layer 116. It comprises an n+ conductivity amorphous silicon alloy. The n+ layer 120 is deposited from any of the gas mixtures previously referred to for the deposition of such material. The n+ layer 120 is deposited to a thickness between 50 and 500 angstroms and serves as a contact layer.

Another transparent conductive oxide (TCO) layer 122 is then deposited over the n+ layer 120. The TCO layer 122 can also be deposited in a vapor deposition environment and, for example, may be indium tin oxide (ITO), cadmium stannate ($Cd_2SnO_4$), or doped tin oxide ($SnO_2$).

On the surface of the TCO layer 122 is deposited a grid electrode 124 made of a metal having good electrical conductivity. The grid may comprise orthogonally related lines of conductive material occupying only a minor portion of the area of the metallic region, the rest of which is to be exposed to solar energy. For example, the grid 124 may occupy only about from 5 to 10% of the entire area of the TCO layer 122. The grid electrode 124 uniformly collects current from the TCO layer 122 to assure a good low series resistance for the device.

To complete the device 110, an anti-reflection (AR) layer or glass encapsulant 126 is applied over the grid electrode 124 and the areas of the TCO layer 122 between the grid electrode areas. The AR layer or glass 126 has a solar radiation incident surface 128 upon which impinges the solar radiation. If the layer 126 is an AR layer, it may have a thickness on the order of magnitude of the wavelength of the maximum energy point of the solar radiation spectrum, divided by four times the index of refraction of the anti-reflection layer 126. A suitable AR layer 126 would be zirconium oxide of about 500 Å in thickness with an index of refraction of 2.1. If the layer 126 is an encapsulant the thickness of TCO layer 122 can be selected to allow it to also act as an anti-reflection layer for the device 110.

As an alternative embodiment, the random surface reflector 111 can comprise a sheet of stainless steel or other metal in place of the glass 112. The roughened surface can be provided by sputtering a highly conductive metal, such as aluminum, over the stainless steel sheet. Aluminum of relatively large grain size can be so sputtered to form a randomly roughened surface. Over the aluminum, a TCO layer, like layer 115 may be deposited.

Nearly all of the photons of the incident light having shorter wavelengths will be absorbed by the active intrinsic layer 118. As a result, the major portion of the photons which are not absorbed and which reach the random surface reflector 111 will have longer wavelengths, about 6000 Å and longer. This incident radiation striking the reflector 111 will be randomly scattered and at least some of these rays will be directed through the intrinsic region 118 at angles sufficient to cause them to be internally reflected at one of the interfaces of layers 118 and 120, layers 120 and 122, layers 122 and 126, or at the interface of layer 126 and the atmosphere above. The rays of incident light which are so directed will be substantially confined within the device 110.

The band gap of the intrinsic layer 118 can be adjusted for a particular photoresponse characteristic with the incorporation of band gap decreasing elements. As a further alternative, the band gap of the intrinsic body 118 can be graded so as to be gradually increasing from the p+ layer 116 to n+ layer 120 (see for example copending U.S. application Ser. No. 206,579 filed in the names of Stanford R. Ovshinsky and David Adler on Nov. 13, 1980 for Methods for Grading the Band Gaps of Amorphous Alloys and Devices, now abandoned and refiled as Ser. No. 427,756 on Sept. 29, 1982 and now abandoned).

For example, as the intrinsic layer 118 is deposited, one or more band gap decreasing elements such as germanium, tin, or lead can be incorporated into the alloys in gradually decreasing concentration. Germane gas (GeH$_4$) for example can be introduced into the glow discharge deposition chamber at a relatively high concentration at first and gradually diminished thereafter as the intrinsic layer is deposited to a point where such introduction is terminated. The resulting intrinsic body will thus have a band gap decreasing element, such as germanium, therein in gradually decreasing concentrations from the p+ layer 116 towards the n+ layer 120.

Figure 5:
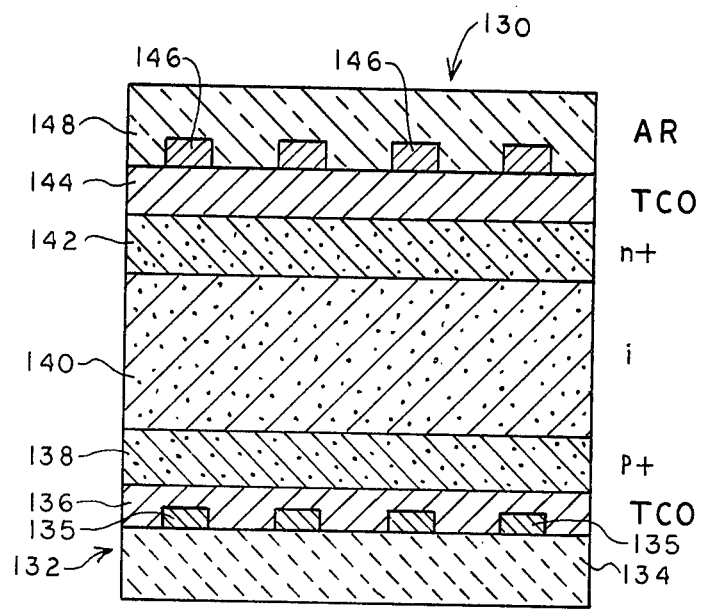
FIG. 5 is a sectional view of a p-i-n photovoltaic device including a random bulk reflector embodying the present invention.

Referring now to FIG. 5, a p-i-n photovoltaic cell 130 is there illustrated which includes a random bulk reflector 132 embodying the present invention. The cell 130 includes a p-type layer 138, an intrinsic layer 140, and a n-type layer 142. The layers 138, 140, and 142 can be formed from the amorphous silicon alloys as previously described with respect to the device 110 of FIG. 4. Also as in the device 110 of FIG. 4, the device 130 includes a layer 144 of transparent conductive oxide, a collection grid 146, and an antireflection layer or glass encapsulant 148.

The random bulk reflector 132 includes a sheet or substantially planar member 134 of a ceramic or enamel material. Such materials have a high index of refraction, for example greater than 1.45, are not light absorptive and have grains and randomly distributed facets of polycrystalline components in their bulk which randomly scatter incident light in all directions. The ceramic or enamel may contain, for example, titanium dioxide, zinc selenide, zinc sulphide, selenium, or silicon carbide. The sheet 134 can also be formed by the codeposition of tin oxide and titanium dioxide.

Because the random scattering of the light from the sheet 134 is a bulk effect, the surface thereof can be polished or otherwise made very smooth. This is advantageous because it presents a smooth surface for the deposition of the semiconductor material. Even though ceramics and enamels can be made electrically conductive to some extent, a layer 136 of transparent conductive oxide (TCO) and a collection grid 135 can be provided between the sheet 134 and p-type amorphous silicon alloy layer 138 to form a bottom contact for the device 130.

Figure 6:
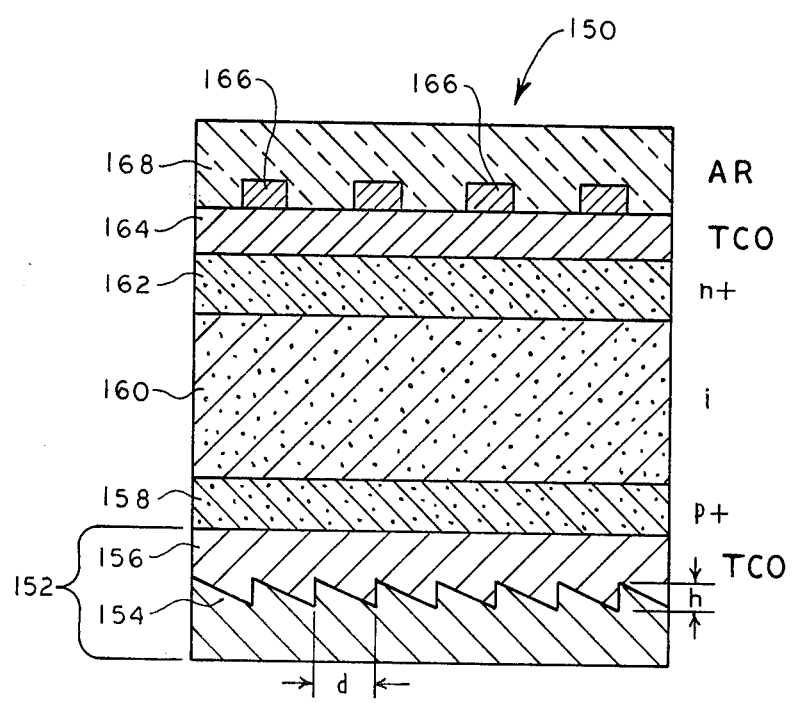
FIG. 6 is a sectional view of a p-i-n photovoltaic device including a periodic surface reflector embodying the present invention.

Referring now to FIG. 6, there is illustrated a p-i-n photovoltaic device 150 which includes a periodic surface reflector 152 embodying the present invention. The cell 150 includes a layer 158 of p-type amorphous silicon alloy, a layer 160 of intrinsic amorphous silicon alloy, and a layer 162 of n-type amorphous silicon alloy. The layers 158, 160, and 162 can be formed from the alloys and processes as previously described. The device also includes a TCO layer 164, a collection grid 166, and an AR layer or glass encapsulant 168.

The periodic surface reflector 152 comprises a reflective diffraction grating 154 which can be formed from a conductive metal such as aluminum to form a back contact for the cell 150 and an overlying layer 156 of transparent conductive oxide. The pattern of the diffraction grating can take any periodic form in cross-section such as a sinusoid, square-wave, or the like. As illustrated, and as a preferred embodiment, the grating 154 is a blazed grating. Gratings of this kind are preferred because the zero (0) order reflections, those normal to the grating, are minimized.

As previously mentioned, periodic reflectors are advantageous because the angles of diffraction can be selected by proper design of the grating. This effectively enables selection of the interface where internal reflection will occur. In the device 150, it is desirable that the internal reflection occur at or below the interface of layers 168 and 164 so that the collection grid is prevented from blocking a portion of the internally reflected light.

In designing a diffraction grating the following expression can be used:

$$\theta_{Diff} = \text{Sin}^{-1} \frac{m\lambda}{nd}$$

Where:
- n is the index of refraction of the medium that the grating diffracts light into;
- λ is the wavelength of light in a vacuum;
- d is the grating spacing; and
- m is the order of diffraction.

The height (h) of the diffraction grating is also a variable which allows adjustment of the intensity of the light diffracted in the various diffraction orders. Generally, to enhance the intensity of the first order of diffracted rays, h should be about a wavelength in height at the frequency of interest.

First order diffraction is also enhanced when d is about equal to a wavelength at the frequency of interest. Here, because most of the shorter wavelength photons are absorbed in the active intrinsic region 160 during their first pass, the longer wavelength photons of about 6600 Å and longer are of interest.

With d being equal to 6600 Å, m being equal to 1 for first order diffraction, and with the grating 154 being coated with a layer 156 of transparent conductive oxide such as indium tin oxide having an index of refraction (n) of 2.1, the above expression can be solved for $\theta_{Diff}$:

$$\theta_{Diff} = \sin^{-1} \frac{6600\text{Å}}{6600\text{Å} \times 2.1} = 28.4°$$

This angle of 28.4° within the TCO layer 156, by Snell's law, is sufficient to direct the rays through the amorphous silicon alloy layers 158, 160, and 162 at an angle greater than the critical angle for an interface of amorphous silicon with air to provide internal reflection at least at the interface of layer 168 and the air. Of course, designing a diffraction grating for higher order diffraction will provide a greater angle to achieve internal reflection before this interface.

Figure 7:
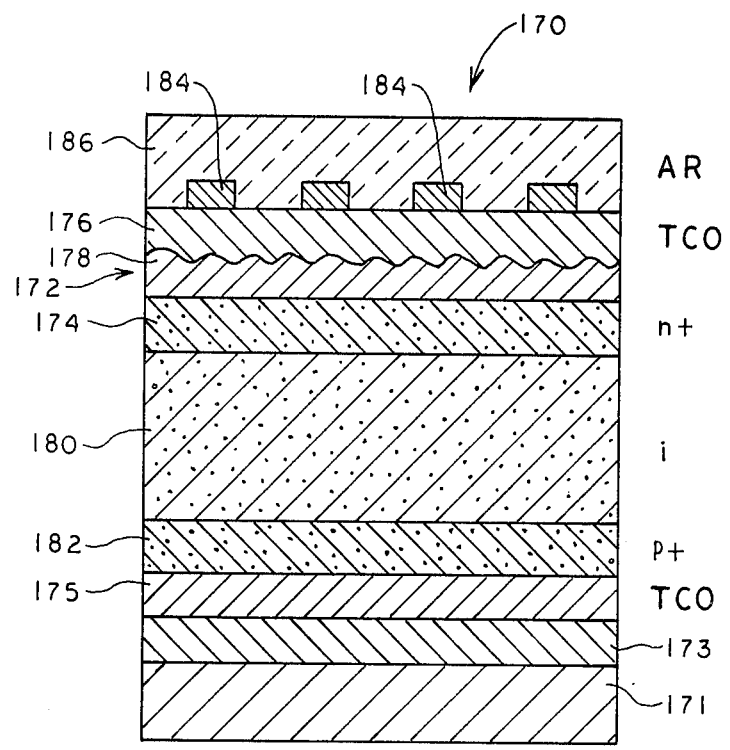
FIG. 7 is a sectional view of a p-i-n photovoltaic device including a transparent incident light director embodying the present invention.

Referring now to FIG. 7, there is illustrated a p-i-n photovoltaic device 170 which includes an incident light directing means 172 disposed between the n-type amorphous silicon alloy layer 174 and the TCO layer 176. The incident light directing means 172 comprises a transmission diffraction grating 178 arranged to direct all of the incident light through the intrinsic region 180 at an angle. However, since nearly all of the shorter wavelength light will be absorbed in the intrinsic region 180 during the first pass, the diffraction grating 178 can be optimized for the longer wavelengths as previously described. Here however, a sinusoidal diffraction grating is illustrated, but it could of course be any of the other types previously mentioned.

Like the previous p-i-n cells described, the cell 170 further includes intrinsic and p-type layers 180 and 182, respectively, of amorphous silicon alloy, a collection grid 184, and a layer 186 of anti-reflection material or glass encapsulant. The various layers are deposited on a substrate 171 of glass, stainless steel, or other suitable substrate material. Deposited over the substrate 171 is a layer 173 of highly conductive and thus highly reflective metal, and a TCO layer 175. The reflective metal layer 173 and TCO layer 175 form a back reflector to reflect unused light back into the intrinsic region 180.

Alternatively, the transparent director can be glass having a roughened surface formed by sandblasting for example. The various amorphous silicon alloy layers can then be deposited onto the roughened surface, followed by the deposition of a specular back reflector. In this form of device, the incident radiation is first directed through the glass substrate. The glass substrate forms a random radiation director disposed on the side of the active region upon which the light first impinges.

Figure 8:
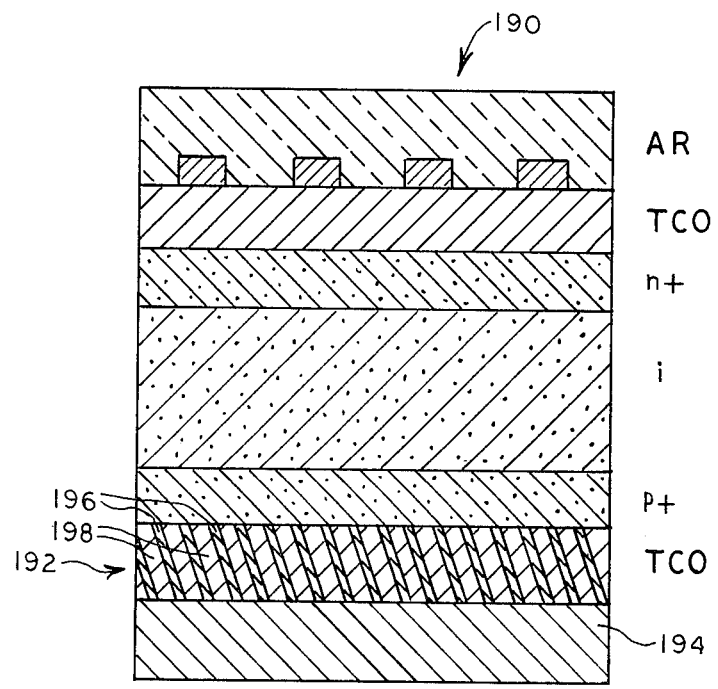
FIG. 8 is a sectional view of a p-i-n photovoltaic device including a periodic bulk reflector embodying the present invention.

Referring now to FIG. 8, there is illustrated another p-i-n photovoltaic cell 190 which includes a periodic bulk reflector 192 embodying the present invention. Because the device 190 is otherwise identical to the cells of FIGS. 4 through 6, only the periodic bulk reflector will be described in detail.

The periodic bulk reflector 192 is disposed upon a substrate 194 of glass, stainless steel, or other suitable substrate material. The periodic bulk reflector 192 takes the form of a hologram comprising a plurality of thin planar members or lines 196 of reflective material, such as aluminum, embedded in a medium 198 of transparent material. Here the transparent material is a transparent conductive oxide, such as indium tin oxide, to provide both a suitable medium for the lines 196, and a bottom contact for the device 190.

The lines 196 are disposed at an angle, are spaced apart, and are substantially parallel. The diffraction of light by a hologram can be predicted by the same expression previously defined for a diffraction grating. Here, the spacing (d) is the spacing between the lines 196.

Because the diffraction of the light occurs in the bulk of the hologram, the upper surface thereof can be polished or otherwise made smooth. This presents a smooth surface upon which the amorphous silicon alloy layer can be deposited.

Figure 9:
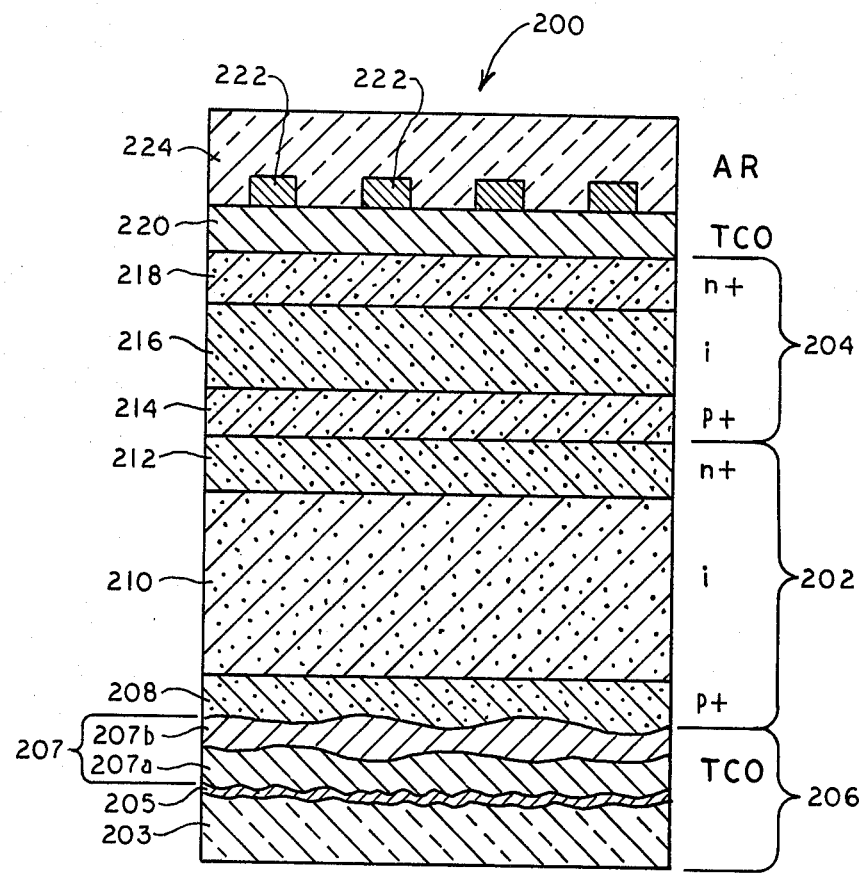
FIG. 9 is a sectional view of a multiple cell incorporating a plurality of p-i-n photovoltaic cell units arranged in tandem configuration which includes a radiation directing means embodying the present invention.

Referring now to FIG. 9, a multiple cell device 200 is there illustrated in sectional view which is arranged in tandem configuration and which includes a random surface reflector embodying the present invention. The device 200 comprises two single cell units 202 and 204 arranged in series relation. As can be appreciated, plural single cell units of more than two can be utilized.

The device 200 includes a random surface reflector 206 including a sand blasted glass layer 203 which is coated with a layer 205 of metal having good reflectivity such as aluminum, for example. Deposited on the metal layer 205 is a layer of transparent conductive oxide 207 which can be a first layer of indium tin oxide 207a and a second layer of doped tin oxide 207b or a single layer of indium tin oxide. The layer 207 of the transparent conductive oxide can be deposited as previously described.

The first cell unit 202 includes a first doped p+ amorphous silicon alloy layer 208 deposited on the transparent conductive oxide layer 207. The p+ layer is preferably a wide band gap p-type amorphous silicon alloy in accordance with the present invention. It can be deposited from any of the previously mentioned starting materials for depositing such material.

Deposited on the wide band gap p+ layer 208 is a first intrinsic amorphous silicon alloy body 210. The first intrinsic alloy body 210 is preferably an amorphous siliconfluorine alloy.

Deposited on the intrinsic layer 210 is a further doped amorphous silicon alloy layer 212. It is opposite in conductivity with respect to the conductivity of the first doped layer 208 and thus is an n+ layer.

The second unit cell 204 is essentially identical and includes a first doped p+ layer 214, an intrinsic body 216 and a further doped n+ layer 218. The device 200 is completed with a TCO layer 220, a grid electrode 222, and an anti-reflection layer or glass encapsulant 224.

The band gaps of the intrinsic layers are preferably adjusted so that the band gap of layer 216 is greater than the band gap of layer 210. To that end, the alloy forming layer 216 can include one or more band gap increasing elements such as nitrogen and carbon. The intrinsic alloy forming the intrinsic layer 210 can include one or more band gap decreasing elements such as germanium, tin, or lead.

It can be noted from the figure that the intrinsic layer 210 of the cell is thicker than the intrinsic layer 216. This allows the entire usable spectrum of the solar energy to be utilized for generating electron-hole pairs.

Although a tandem cell embodiment has been shown and described herein, the unit cells can also be isolated from one another with oxide layers for example to form a stacked multiple cell. Each cell could include a pair of collection electrodes to facilitate the series connection of the cells with external wiring.

As a further alternative, and as mentioned with respect to the single cells previously described, one or more of the intrinsic bodies of the unit cells can include alloys having graded band gaps. Any one or more of the band gap increasing or decreasing elements previously mentioned can be incorporated into the intrinsic alloys for this purpose. Reference may also be made to copending U.S. Application Ser. No. 206,580 filed in the names of Stanford R. Ovshinsky and David Adler on Nov. 13, 1980 for Multiple Cell Photoresponsive Amorphous Alloys and Devices, now abandoned and refiled as Ser. No. 427,757 on Sept. 29, 1982.

Figure 10:
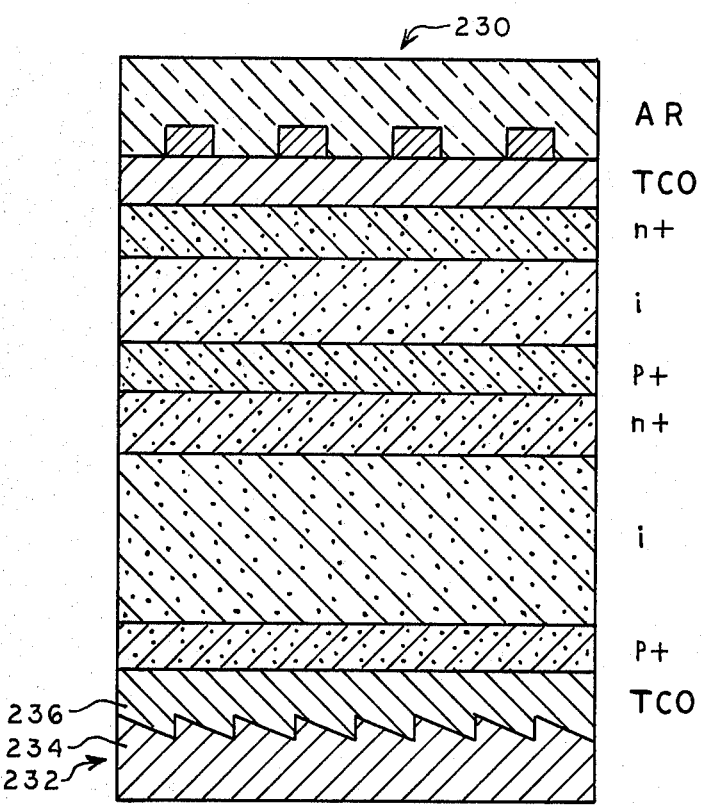
FIG. 10 is a sectional view of another tandem device including a periodic surface reflector embodying the present invention.

Referring now to FIG. 10, there is illustrated a tandem p-i-n photovoltaic cell 230 which is substantially identical to the tandem cell 200 of FIG. 9 except that the cell 230 includes a periodic surface reflector 232. Therefore, this cell will be described in detail only with respect to the reflector 232.

Like the embodiment of FIG. 6, the periodic surface reflector 232 takes the form of a reflective diffraction grating 234. Although the grating 234 can be a sinusoidal, square-wave, or other periodic configuration, the grating 234 here again as illustrated is a blazed grating. The grating can be formed from a soft metal, such as aluminum. It is coated with a layer 236 of transparent conductive oxide, such as indium tin oxide, cadmium stannate, or doped tin oxide, upon which the amorphous silicon alloys can be deposited. The diffraction grating 234 operates in the same manner as previously described in relation to FIG. 6.

Figure 11:
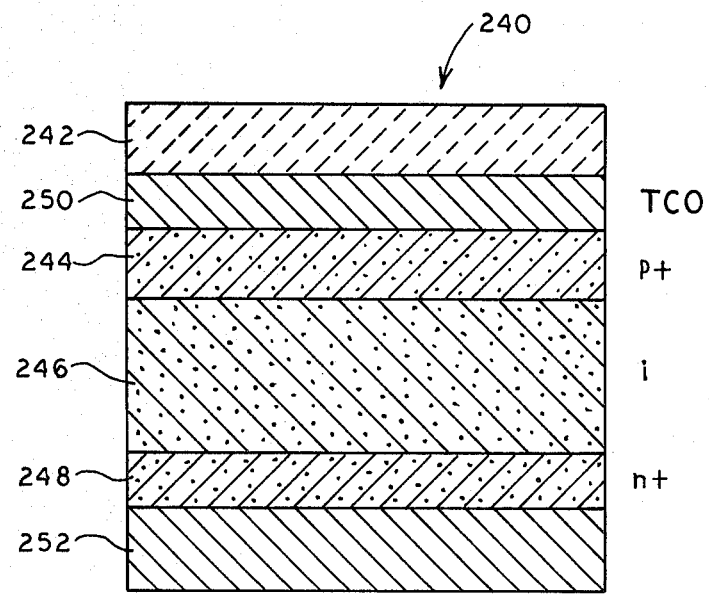
FIG. 11 is a sectional view of a p-i-n photovoltaic device structured in accordance with a still further embodiment of the present invention.

Referring now to FIG. 11, it illustrates another single cell p-i-n photovoltaic device 240 embodying the present invention. Here, a transparent substrate 242 formed from glass, for example, has a TCO layer 250 and p-type, intrinsic, and n-type amorphous silicon alloy layers 244, 246, and 248 respectively successively deposited thereon. Over the n-type layer 248 is provided a layer 252 of a conductive, light diffusant paint. The layer 252 can be formed from aluminum or gold paint, for example. Such paints are conductive and, when applied by wiping or spraying, or the like, will form a random light scattering interface between the layers 248 and 252. Alternatively, the layer 252 can comprise a first layer of a transparent conductor such as a transparent conductive oxide, and a second layer of a nonconductive, but light scattering paint such as a flat white paint having a high titanium content.

The device of FIG. 11 is configured to receive the incident light radiation through the glass substrate. The incident light not absorbed during the first pass through the device will be randomly scattered by the layer 252. At least some of the scattered light rays will be directed through the amorphous silicon layers 248, 246, and 244 at angles sufficient to cause these rays to be internally reflected and substantially confined within the device 240.

As can be appreciated from the foregoing, the present invention provides new and improved photovoltaic cells which provide enhanced short circuit currents and efficiencies. The incident radiation directors herein disclosed provide a means by which at least a portion of the incident light can be directed through the active region or regions of the cells, at angles sufficient to cause internal reflection within the cells and thus substantially total confinement of the light therein. Because the light is permitted to make multiple passes through the active region or regions, the active regions can be made thinner than previously allowed. This enables more efficient collection of the photogenerated charge carriers while at the same time more of the light is absorbed.

For each embodiment of the invention described herein, the alloy layers other than the intrinsic alloy layers can be other than amorphous layers, such as polycrystalline layers. (By the term "amorphous" is meant an alloy or material which has long range disorder, although it may have short or intermediate order or even contain at times some crystalline inclusions.)

Modifications and variations of the present invention are possible in light of the above teachings. It is therefore, to be understood that within the scope of the appended claims the invention may be practiced otherwise than as specifically described.

What is claimed and described to be secured by Letters Patent of the United States is:

1. In a photovoltaic device formed from semiconductor material including at least one active region upon which incident radiation can impinge to produce charge carriers, the improvement comprising a random bulk reflector for directing at least a portion of said incident radiation through said at least one active region at an angle sufficient to cause said directed radiation to be substantially confined within said photovoltaic device.

2. A device as defined in claim 1 wherein said random bulk reflector is disposed adjacent said active region on the side thereof opposite the side upon which the radiation first impinges.

3. A device as defined in claim 2 wherein said random bulk reflector comprises a planar member formed from a material having an index of refraction greater than 1.45 and which is non-absorbing of light which impinges thereon.

4. A device as defined in claim 2 wherein said random bulk reflector comprises a planar member formed from a ceramic material.

5. A device as defined in claim 4 wherein said ceramic material is formed from one of the group consisting of titanium dioxide, zinc selenide, zinc sulphide, selenium, and silicon carbide.

6. A device as defined in claim 2 wherein said random bulk reflector comprises a planar member coated with an enamel material.

7. A device as defined in claim 2 wherein said random bulk reflector comprises a layer of co-deposited tin oxide and titanium dioxide.

8. In a photovoltaic device formed from semiconductor material including at least one active region upon which incident radiation can impinge to produce charge carriers, the improvement comprising a periodic bulk reflector for directing at least a portion of said incident radiation through said at least one active region at an angle sufficient to cause said directed radiation to be substantially confined within said photovoltaic device, said reflector being disposed adjacent said active region on the side thereof opposite the side upon which the incident radiation first impinges.

9. A device as defined in claim 8 wherein said periodic bulk reflector comprises a hologram.

10. A device as defined in claim 9 wherein said hologram comprises a plurality of relatively thin reflective planar members disposed within a solid transparent medium, said planar members being disposed in spaced apart parallel relation and at an angle to the incident radiation.

11. A device as defined in claim 10 wherein said reflective planar members are formed from aluminum.

12. A device as defined in claim 10 wherein said transparent medium comprises a transparent conductive oxide.

13. A photovoltaic device formed from multiple layers of amorphous silicon alloys, said device comprising: a cell body including a first doped amorphous silicon alloy layer; a body of intrinsic amorphous silicon alloy deposited on said first doped layer upon which incident radiation can impinge to produce charge carriers; a further doped amorphous silicon alloy layer deposited on said intrinsic body and being of opposite conductivity with respect to said first doped amorphous silicon alloy layer; and a random bulk reflector for directing at least a portion of said incident radiation through said body of intrinsic amorphous silicon alloy at an angle sufficient to cause said directed radiation to be substantially confined within said photovoltaic device; one of said doped layers forming the bottom most layer of said device upon which said incident radiation last impinges, and said random bulk reflector being disposed beneath said one doped layer.

14. A device as defined in claim 13 wherein said random bulk reflector comprises a body of ceramic material.

15. A device as defined in claim 14 wherein said ceramic material is titanium dioxide, zinc selenide, zinc sulphide, selenium, or silicon carbide.

16. A device as defined in claim 13 wherein said random bulk reflector comprises a body of enamel material.

17. A device as defined in claim 13 wherein said random bulk reflector comprises a body of co-deposited tin oxide and titanium dioxide.

18. A photovoltaic device formed from multiple layers of amorphous silicon alloys, said device comprising: a cell body including a first doped amorphous silicon alloy layer; a body of intrinsic amorphous silicon alloy deposited on said first doped layer upon which incident radiation can impinge to produce charge carriers; a further doped amorphous silicon alloy layer deposited on said intrinsic body and being of opposite conductivity with respect to said first doped amorphous silicon alloy layer; and a periodic bulk reflector for directing at least a portion of said incident radiation through said body of intrinsic amorphous silicon alloy at an angle sufficient to cause said directed radiation to be substantially confined within said photovoltaic device; one of said doped layers forming the bottom most layer of said device upon which said incident radiation last impinges, and said periodic bulk reflector being disposed beneath said one doped layer.

19. A device as defined in claim 18 wherein said periodic bulk reflector comprises a hologram.

* * * * *

UNITED STATES PATENT AND TRADEMARK OFFICE
CERTIFICATE OF CORRECTION

PATENT NO. : 4,419,533

DATED : December 6, 1983

INVENTOR(S) : Wolodymyr Czubatyj, et al.

It is certified that error appears in the above-identified patent and that said Letters Patent is hereby corrected as shown below:

```
Column  2, line 19, delete "crystal line" and insert
--crystalline--;
Column  2, line 34, delete "which" and insert --where--;
Column  3, line  9, after "tube", delete "and";
Column  3, line 44, delete "silicone" and insert
--silicon--;
Column  9, line 26, after "(SiH4)", insert --or--;
Column 11, line 40, delete "adsorbed" and insert
--absorbed--;
Column 13, line 55, should not start a new paragraph
```

Signed and Sealed this

Twenty-third Day of October 1984

[SEAL]

*Attest:*

GERALD J. MOSSINGHOFF

*Attesting Officer*  *Commissioner of Patents and Trademarks*